United States Patent [19]
Park

[11] Patent Number: 6,107,169
[45] Date of Patent: Aug. 22, 2000

[54] METHOD FOR FABRICATING A DOPED POLYSILICON FEATURE IN A SEMICONDUCTOR DEVICE

[75] Inventor: Stephen Keetai Park, Cupertino, Calif.

[73] Assignee: Advanced Micro Devices, Inc., Sunnyvale, Calif.

[21] Appl. No.: 09/134,526

[22] Filed: Aug. 14, 1998

[51] Int. Cl.[7] .................................................. H01L 21/425
[52] U.S. Cl. ........................... 438/532; 438/264; 438/923
[58] Field of Search .................................... 438/257, 264, 438/532, 923

[56] References Cited

U.S. PATENT DOCUMENTS

| 4,669,176 | 6/1987 | Kato ........................................ 438/923 |
| 4,769,340 | 9/1988 | Chang et al. ........................... 438/264 |
| 5,147,813 | 9/1992 | Woo ........................................ 438/923 |

OTHER PUBLICATIONS

Wolf, Silicon Processing for the VLSI Era, vol. 1: Process Technology, pp. 294–295, 321–325, 1986.

*Primary Examiner*—Chandra Chaudhari

[57] ABSTRACT

In a non-volatile semiconductor memory device, a top surface of a floating gate that is made of polysilicon is advantageously kept smooth to increase the uniformity of an overlying interpoly dielectric layer onto which a control gate is formed. The floating gate is doped after at least a portion of the overlying interpoly dielectric layer has been formed. Ion implantation techniques are employed to implant dopants through the overlying layer or layers and into the floating gate. Consequently, the potential for polysilicon grain growth at or near the top surface of the floating gate, which can lead to significant depressions in the overlying layers and data retention problems in the memory cell, is substantially reduced.

19 Claims, 4 Drawing Sheets

US 6,107,169

METHOD FOR FABRICATING A DOPED POLYSILICON FEATURE IN A SEMICONDUCTOR DEVICE

TECHNICAL FIELD

The present invention relates to semiconductor devices and manufacturing processes, and more particularly to methods and arrangements associated with a doped polysilicon floating gate in non-volatile memory semiconductor devices.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxides 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide—nitride—oxide (ONO) layer.

The continued shrinking of the memory cells, and in particular the basic features depicted in the memory cells of FIGS. 1a–b, places a burden on the fabrication process to deposit and subsequently pattern a layer stack to form a floating gate/control gate structure, without creating deleterious effects within the resulting memory cells. Of particular concern is the need to control the formation of the interpoly dielectric layer and the surface interface it shares with the underlying floating gate and overlying control gate. For example, in reduced-size semiconductor devices it is preferred that the surface of the floating gate be smooth to allow the overlying interpoly dielectric layer to be significantly smooth. If the interpoly dielectric layer is not significantly smooth, the attendant roughness can lead to deleterious electron charging within the interpoly dielectric layer during operation of the device. Thus, there is a need to reduce the surface roughness of the floating gate layer.

SUMMARY OF THE INVENTION

These needs and others are met by the present invention, which provides methods that increase the process control during the formation of floating gate and interpoly dielectric layers.

In accordance with one aspect of the present invention, the interface between a top surface of a polycrystalline silicon (i.e., polysilicon) layer and the bottom surface of an overlying dielectric layer is carefully controlled to significantly reduce or completely avoid the formation of large grains of polysilicon that can cause deleterious effects in the semiconductor device due to their inherent "roughness". In accordance with one aspect of the present invention, the polysilicon layer is left undoped until the overlying dielectric layer is formed, thereby maintaining a relatively small grain formation at or near the top surface of the polysilicon layer. The small grains advantageously provide a "smoother" surface on the polysilicon layer. The polysilicon layer is then doped by implanting impurity atoms (i.e., dopants) through the overlying dielectric layer and into the polysilicon layer.

Thus, in accordance with certain embodiments of the present invention, a method is provided for doping a polycrystalline silicon layer in a semiconductor device. The method includes forming a first substantially undoped polycrystalline silicon layer over a substrate and forming a dielectric layer on the first substantially undoped polycrystalline silicon layer. The method further includes implanting dopants through the dielectric layer and into the underlying first substantially undoped polycrystalline silicon layer. In accordance with certain embodiments, the method further includes forming at least a second polycrystalline silicon layer on the dielectric layer. The method then includes the implanting the dopants through the second polycrystalline silicon layer, the dielectric layer, and into the first substantially undoped polycrystalline silicon layer to create a first doped polycrystalline silicon layer. In accordance with still other embodiments of the invention, the dopants can includes phosphorus (P), arsenic (As), antimony (Sb), boron (B), gallium (Ga), Indium (In), aluminum (Al), or other similar conventional dopants.

The above stated needs and others are also met by a method for fabricating a doped polycrystalline silicon feature in a semiconductor device, in accordance with certain embodiments of the present invention. The method includes forming a first layer of polycrystalline silicon, wherein the first layer of polycrystalline silicon is not significantly doped, selectively patterning the first layer of polycrystalline silicon to form at least one feature, forming a dielectric layer on at least a portion of the feature, and then doping at least a portion of the polycrystalline silicon within the feature by implanting dopants through the dielectric layer and into the feature. In certain other embodiments, the method also includes forming a second layer of polycrystalline silicon on at least a portion of the dielectric layer, and the step of doping at least a portion of the polycrystalline silicon within the feature further includes implanting the dopants through the second layer of polycrystalline silicon before implanting the dopants through the dielectric layer and into the feature.

In accordance with still other embodiments of the present invention, a method for forming a non-volatile memory cell is provided. The method includes forming a tunnel oxide on a substrate, forming a floating gate on the tunnel oxide, wherein the floating gate is substantially undoped polycrystalline silicon, forming an interpoly dielectric layer on the floating gate, forming at least a portion of a control gate on the interpoly dielectric layer, wherein the control gate includes polycrystalline silicon, and implanting dopants through the portion of the control gate, the interpoly dielectric layer, and into the floating gate. In certain other embodiments, the method further includes forming any remaining portions of the control gate to form a completed control gate and forming a silicide layer on the completed control gate.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
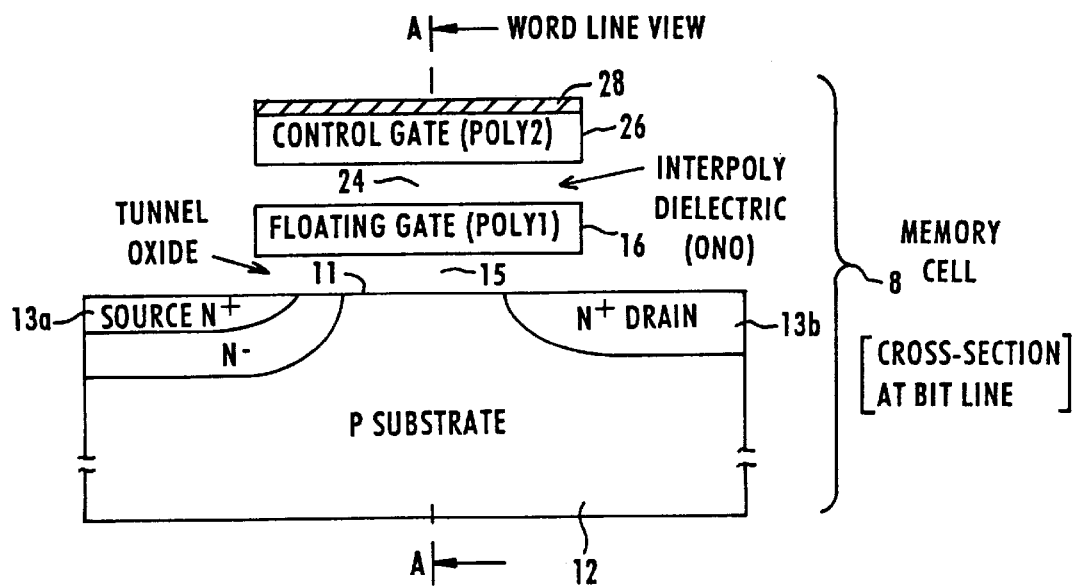
FIG. 1a depicts a cross-sectional view of a portion of a typical prior art semiconductor device having at least one memory cell, as viewed at the bit-line.
Figure 1B:
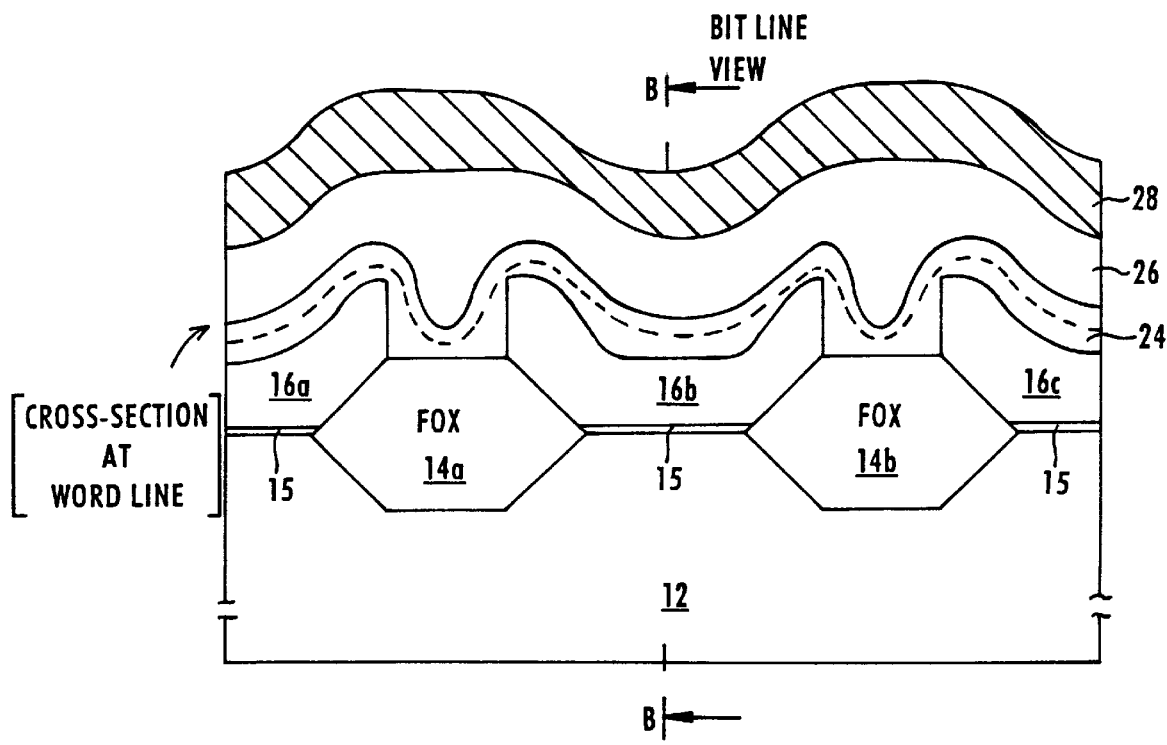
FIG. 1b depicts a cross-sectional view of a portion of a typical prior art semiconductor device, as in FIG. 1, having at least one memory cell, as viewed at the word-line.
Figure 2A:
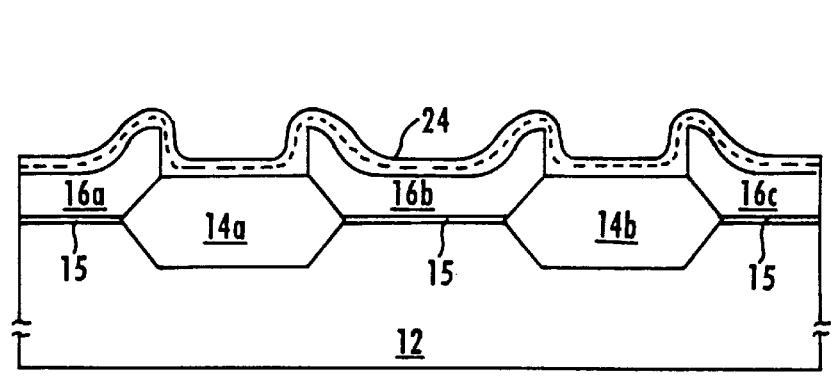
FIG. 2a depicts a cross-sectional view of a portion of a typical prior art semiconductor device, as in FIGS. 1a–b, following deposition of a conformal interpoly dielectric layer over a plurality of patterned floating gates.

A typical floating gate, e.g. 16b as shown in FIGS. 1b and 2a, is formed from a first layer of polycrystalline silicon (polysilicon) which is commonly referred to as a "Poly 1" layer. In order for floating gate 16b to conduct electricity, the Poly 1 must be doped. There are at least three conventional methods for forming/doping the Poly 1 layer. In a first method, the Poly 1 layer is deposited, for example, using conventional chemical vapor deposition (CVD) techniques, and doped using conventional diffusion techniques. By way of example, the Poly 1 layer can be thermally diffused by heating it and exposing it to a dopant source, such as, POCl$_3$. In a second method the Poly 1 layer is deposited and doped at the same time, for example, by introducing phosphorous (P) dopants into a conventional CVD. In a third method, the Poly 1 layer is deposited, substantially undoped, and dopants are then implanted into the Poly 1 layer using conventional ion-implantation techniques through the dielectric layer grown on top of Poly 1.

Regardless of the method used, the Poly 1 layer is typically doped prior to the formation of any further layers/ materials, such as, for example, an overlying interpoly dielectric layer 24. As described below, in accordance with certain aspects of the present invention, it has been found that doping the Poly 1 layer prior to the formation of the interpoly dielectric layer 24 can reduce the effectiveness of the interpoly dielectric layer 24, especially within reduced-size semiconductor devices.

FIG. 2a depicts an exemplary cross-sectional view of a portion 10 of a typical prior art semiconductor, similar to FIGS. 1a–b, following the formation of a Poly 1 layer that has been doped and selectively patterned to form floating gates 16a–b. A conformal interpoly dielectric layer 24 has been deposited over the exposed surfaces of floating gates 16a–b and field oxides 14a–b using conventional CVD techniques, for example.

Figure 2B:
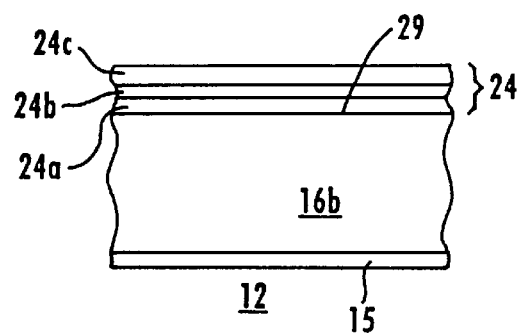
FIG. 2b depicts an enlarged view of the interface between the interpoly dielectric and one of the underlying floating gates, as in FIG. 2a, wherein the interpoly dielectric layer is shown as having a plurality of films.

FIG. 2b depicts an enlarged view of the interface between the interpoly dielectric layer 24 and floating gate 16b in FIG. 2a. In this exemplary embodiment, interpoly dielectric layer 24 is an ONO layer that includes a first silicon dioxide film 24a formed on a top surface 29 of floating gate 16b, a silicon nitride film 24b formed on first silicon dioxide film 24a, and a second silicon dioxide film 24c formed on silicon nitride film 24b. Films 24a–c can be formed using conventional deposition techniques.

Figure 2C:
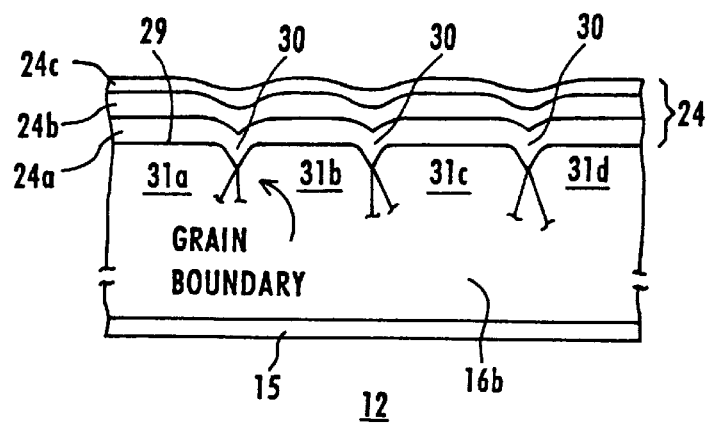
FIG. 2c depicts a further enlarged view of the interface between the plurality of films of the interpoly dielectric and the underlying floating gates, as in FIG. 2b, wherein a top surface of the floating gate includes doped polysilicon that is depicted as an aggregate of significantly large crystallites called grains, which are separated by grain boundaries, and the interpoly dielectric layer is shown as having a plurality of significant depressions over the grain boundaries.

FIG. 2c depicts a greatly enlarged view of the interface between the interpoly dielectric layer 24 and the top surface 29 of underlying floating gate 16b of FIG. 2b. Floating gate 16b is formed from a previously doped Poly 1 layer having a top surface 29 that is essentially an aggregate of significantly large crystallites called grains 31a–d, which are separated by grain boundaries 30. As described below, the formation of the large grains is due to the doping of the polysilicon layer. As shown, interpoly dielectric layer 24, which is conformally deposited on top surface 29, tends to form a plurality of significant depressions over the grain boundaries 30.

It has been found that the oxidation rate of doped polysilicon is significantly greater than the oxidation rate of undoped polysilicon. Since floating gate 16b is doped prior to the formation of the interpoly dielectric layer 24 there tends to be significant oxidation of the polysilicon in floating gate 16b during the formation of the first silicon dioxide film 24a within interpoly dielectric layer 24. The oxidation of floating gate 16b tends to cause the large granular growth (as depicted in FIG. 2c) at or near top surface 29. The larger grains 31a–d and grain boundaries 30, which form because of oxidation, essentially cause the top surface 29 to become "rough".

This "surface roughness" of floating gate 16b is often carried over into the interpoly dielectric layer 24. For example, there tends to be depressions formed in interpoly dielectric layer 24, over grain boundaries 30 (for example, see FIG. 2c). If severe enough, these depressions can also be replicated in a subsequently formed control gate 26 (i.e., the Poly 2 layer). In a completed and operating semiconductor device, for example, a memory cell 8, these types of varying depressions can lead to increased concentration in the electrical field, which can cause leakage currents within the device, and/or lower the breakdown voltage of the device. These types of problems can significantly affect the performance of the semiconductor device. For example, leakage currents can significantly reduce the data retention capabilities in memory cell 8.

In accordance with certain embodiments of the present invention, the "surface roughness", as described above, which is at or near top surface 29 of floating gate 16b, for example, is substantially avoided by delaying doping until after at least a portion of the interpoly dielectric layer 24 has been formed. Since undoped polysilicon is more resistant to oxidation, the grains at or near the top surface 29 will be tend to remain smaller and present smaller grain boundaries, resulting in a "smoother" top surface. Consequently, a subsequently formed interpoly dielectric layer will not have depressions as severe as those found in the prior-art.

Figure 3A:
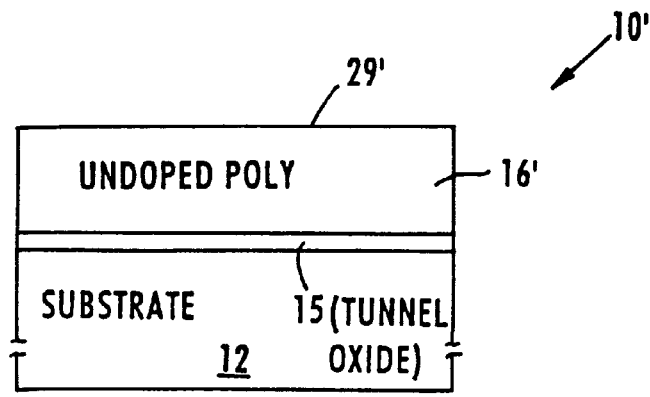
FIG. 3a depicts a cross-sectional view of a portion of a semiconductor device having a substantially undoped polysilicon layer having significantly small grains, and which can be used to form a plurality of floating gates, in accordance with certain embodiments of the present invention.

With this in mind, FIG. 3a depicts a cross-sectional view of a portion 10' of a semiconductor device, in accordance with certain embodiments of the present invention, having a substantially undoped Poly 1 layer 16' that has significantly small grains and/or grain boundaries, and which is suitable for forming a plurality of floating gates. Poly 1 layer 16' can be formed using conventional deposition techniques, including CVD. In accordance with certain embodiments of the present invention, to form a floating gate, such as floating gate 16b, Poly 1 layer 16' is preferably at least about 600 Angstroms thick, and more preferably less than about 2000 Angstroms thick.

Figure 3B:
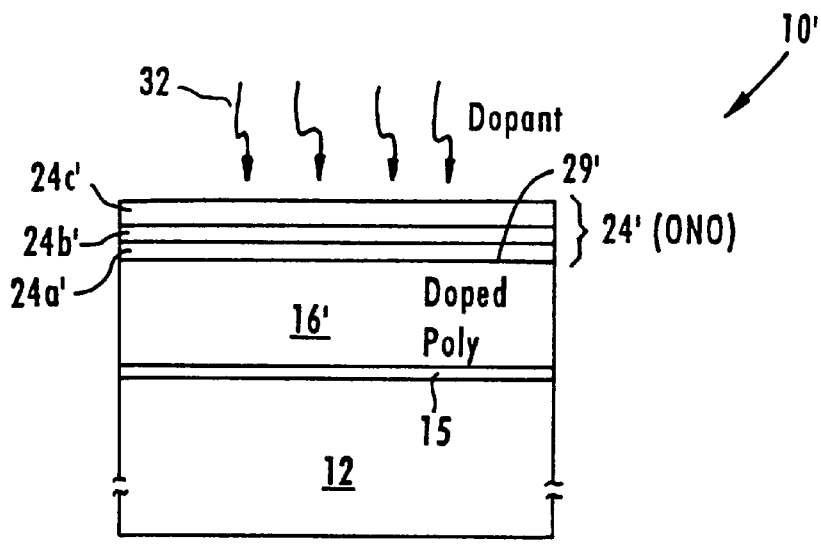
FIG. 3b depicts the portion of FIG. 3a following formation of a multiple film interpoly dielectric layer, without significant depressions therein, on the substantially undoped polysilicon layer, and the subsequent implantation of dopants through the interpoly dielectric layer and into the underlying polysilicon layer, in accordance with certain embodiments of the present invention.

FIG. 3b depicts the portion 10' of FIG. 3a following formation of an interpoly dielectric layer 24' on top surface 29'. Interpoly dielectric layer 24', in accordance with certain embodiments of the present invention, is an ONO layer having a first silicon dioxide film 24a', a silicon nitride film 24b' and a second silicon dioxide film 24c'. Because top surface 29' is "smooth", the films 24a–c' in interpoly dielectric layer 24' tend to be uniform in thickness and without significant depressions formed therein. Dopants 32 are then implanted through interpoly dielectric layer 24' and into Poly 1 layer 16', using conventional ion-implantation techniques.

Thus, in accordance with a first exemplary embodiment of the present invention, a process is provided that includes depositing an undoped Poly 1 layer 16' on tunnel oxide 15, using conventional deposition techniques. The undoped Poly 1 layer 16' is patterned to form at least one floating gate 16b, for example, by employing conventional masking and etching processes. At least a portion of the interpoly dielectric layer 24' is then formed on the top surface 29' of the patterned portions of the undoped Poly 1 layer 16'. Next, the patterned portions of the undoped Poly 1 layer 16' are doped by implanting dopants 32 through the, interpoly dielectric layer 24' and into the Poly 1 layer 16'. For example, phosphorus (P) ions can be implanted through the interpoly dielectric layer 24' and into the Poly 1 layer 16' using conventional ion-implantation techniques. Other dopants include, but are not limited to, arsenic (As), antimony (Sb), boron (B), gallium (Ga), Indium (In) and aluminum (Al).

Figure 3C:
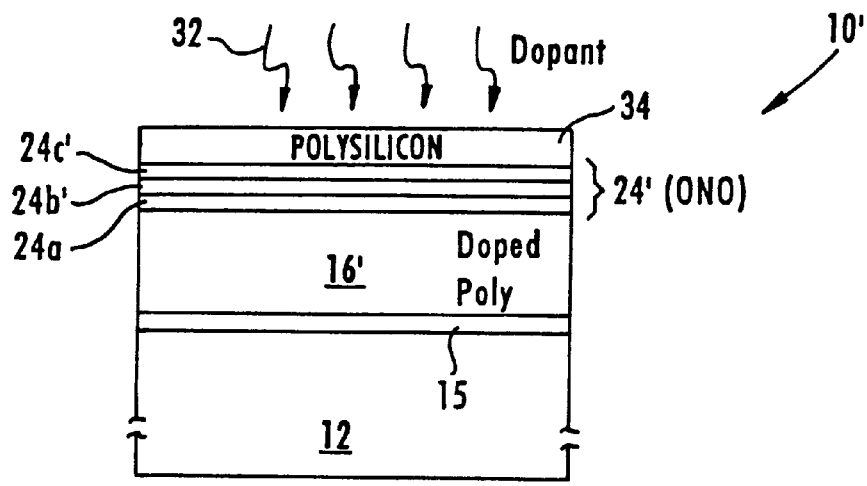
FIG. 3c depicts the portion of FIG. 3b following formation of at least a portion of a second layer of polysilicon on the interpoly dielectric layer prior to the implantation of dopants into the underlying polysilicon layer, in accordance with certain embodiments of the present invention.

Referring next to FIG. 3c, in accordance with still other embodiments of the present invention the doping of the remaining portions of the Poly 1 layer 16' occurs after at least a first portion 34 (e.g., at least about 20 Angstroms thick) of the Poly 2 layer 26' has been formed on interpoly dielectric layer 24'. This method is preferred in certain embodiments, because ionimplantation directly into an exposed silicon dioxide film (e.g., either first or second silicon dioxide films 24a' or 24c') of the interpoly dielectric layer 24' can cause the silicon dioxide to be charged. This charging can led to charging damage that reduces the insulating characteristics of the interpoly dielectric layer 24'.

In still further embodiments, a silicide layer is formed over the Poly 2 layer 26'. The implanting of dopants is then performed through the silicide layer, as well as through the Poly 2 layer, the interpoly dielectric layer, and the Poly 1 layer.

Figure 3D:
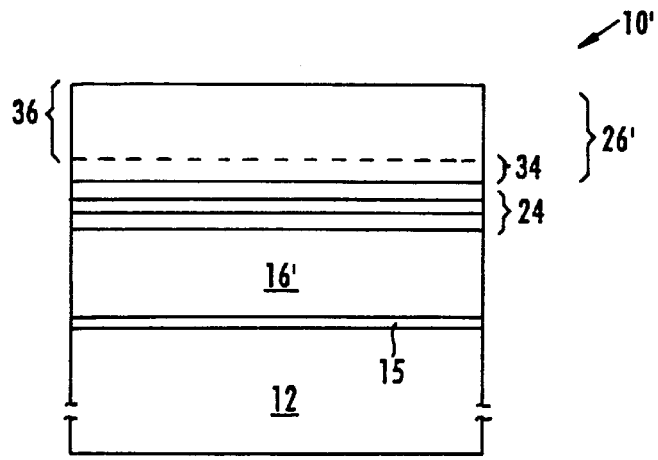
FIG. 3d depicts the portion of FIG. 3c following formation of a remaining portion of the second polysilicon layer, such that the second layer of polysilicon is suitable for forming a control gate, in accordance with certain embodiments of the present invention.

Once first portion 34 of the Poly 2 layer 26' has been formed on interpoly dielectric layer 24', dopants 32 are implanted through first portion 34, interpoly dielectric layer 24', and into Poly 1 layer 16', using conventional ion implantation techniques. Then, as depicted in FIG. 3d, a second portion 36 of the Poly 2 layer 26' can be formed on a first portion 34 to complete the formation of the Poly 2 layer 26'. By way of example, in accordance with certain embodiments of the present invention, the Poly 2 layer 26' is preferably at least about 200 Angstroms thick, and more preferably less than about 2000 Angstroms thick.

Figure 4:
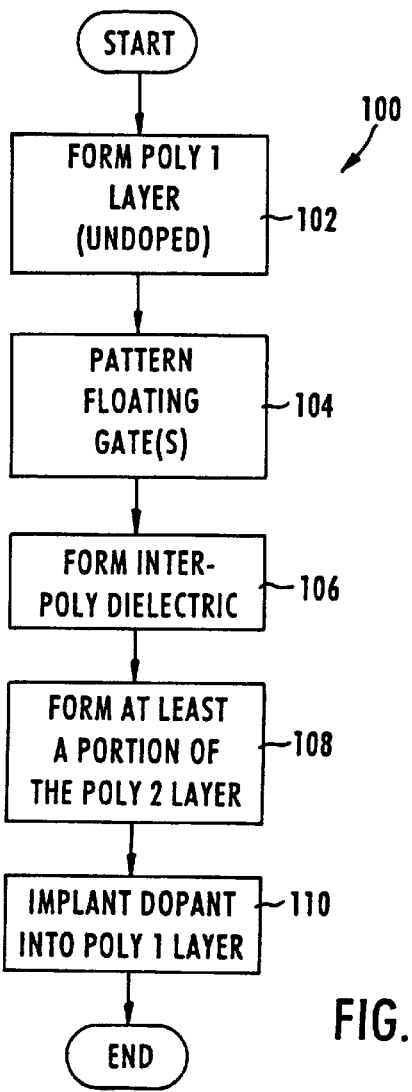
FIG. 4 is a flowchart depicting a method for forming a doped polysilicon floating gate in a semiconductor device, in accordance with certain embodiments of the present invention.

FIG. 4 is a flowchart depicting an exemplary method 100 for forming a doped polysilicon floating gate in a semiconductor device, in accordance with certain embodiments of the present invention. Method 100 includes forming an undoped Poly 1 layer 16' within a portion 10', in step 102. The Poly 1 layer 16' is then selectively patterned to form at least one floating gate (e.g., 16b), in step 104. Then, in step 106, an interpoly dielectric layer 24' is formed on the Poly 1 layer 16', followed by at least a first portion 34 of a Poly 2 layer 26', in step 108. In step 110, dopants are implanted through the overlying layers (e.g., 24', and 34/26') and into the Poly 1 layer 16'. In accordance with other embodiments of the present invention, implantation is performed prior to the step of forming the Poly 2 layer (step 108), although it is possible that the interpoly dielectric layer will be damaged by the charging in this additional step.

Ion implantation techniques are known to those skilled in the art and can be readily adapted to meet the requirements for a specific semiconductor device, in accordance with the various embodiments of the present invention. By way of example, in an exemplary semiconductor device phosphorous ions can be implanted through an ONO interpoly dielectric layer and into the underlying floating gate by employing a Varian ET 200 ion implantation tool, which is manufactured and available from Varian Associates, Inc. of Palo Alto, Calif.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for doping a polycrystalline silicon layer in a semiconductor device, the method comprising:
    forming a first substantially undoped polycrystalline silicon layer over a substrate;
    forming a dielectric layer on the first substantially undoped polycrystalline silicon layer;
    forming a second polycrystalline silicon layer on the dielectric layer; and
    implanting dopants through the second polycrystalline silicon layer, through the dielectric layer, and into the first substantially undoped polycrystalline silicon layer to create a first doped polycrystalline silicon layer.

2. The method as recited in claim 1, wherein the step of forming the second polycrystalline silicon layer on the dielectric layer further comprises depositing at least about 20 Angstroms of polycrystalline silicon on the dielectric layer.

3. The method as recited in claim 1, wherein the second polycrystalline silicon layer is configured to be at least a portion of a control gate.

4. The method as recited in claim 2, further comprising forming a silicide layer on the second polycrystalline silicon layer, wherein the dopants are implanted through the silicide layer.

5. The method as recited in claim 1, further comprising:
    forming a tunnel oxide layer on the substrate prior to forming the first substantially undoped polycrystalline silicon layer, wherein the first substantially undoped polycrystalline silicon layer is formed on the tunnel oxide layer; and
    selectively removing portions of the first substantially undoped polycrystalline silicon layer and the tunnel oxide layer to form at least one floating gate.

6. The method as recited in claim 5, wherein the step of forming the first substantially undoped polycrystalline silicon layer further comprises using a chemical vapor deposition (CVD) process.

7. The method as recited in claim 5, wherein the first substantially undoped polycrystalline silicon layer has a thickness of at least 200 Angstroms.

8. The method as recited in claim 1, wherein the step of forming the dielectric layer comprises:
    forming a first dielectric film on the first substantially undoped polycrystalline silicon layer;
    forming a second dielectric film on the first dielectric film; and
    forming a third dielectric film on the second dielectric film.

9. The method as recited in claim 8, wherein the first dielectric film comprises silicon dioxide, the second dielectric film comprises silicon nitride, and the third dielectric film comprises silicon dioxide.

10. The method as recited in claim 1, wherein the step of implanting dopants through the dielectric layer and into the underlying first substantially undoped polycrystalline silicon layer further includes generating dopant ions and causing the dopant ions to be implanted into the first substantially undoped polycrystalline silicon layer.

11. The method as recited in claim 1, wherein the step of implanting dopants includes implanting at least one dopant selected from a group comprising phosphorus (P), arsenic (As), antimony (Sb), boron (B), gallium (Ga), Indium (In) and aluminum (Al).

12. A method for fabricating a doped polycrystalline silicon feature in a semiconductor device, the method comprising:
    forming a first layer of polycrystalline silicon, wherein the first layer of polycrystalline silicon is not significantly doped;
    selectively patterning the first layer of polycrystalline silicon to form at least one feature;
    forming a dielectric layer on at least a portion of the feature;
    forming a second layer of polycrystalline silicon, wherein the second layer of polycrystalline silicon is on at least a portion of the dielectric layer; and
    doping at least a portion of the first layer of polycrystalline silicon within the feature by implanting dopants through the second polycrystalline silicon layer, through the dielectric layer, and into the feature.

13. The method as recited in claim 12, wherein the dielectric film includes a plurality of dielectric films and the step of forming the dielectric layer further comprises sequentially forming the plurality of dielectric films.

14. The method as recited in claim 13, wherein at least one of the plurality of dielectric films comprises silicon dioxide.

15. The method as recited in claim 12, wherein the step of doping includes implanting at least one dopant selected from a group comprising phosphorus (P), arsenic (As), antimony (Sb), boron (B), gallium (Ga), Indium (In) and aluminum (Al).

16. A method for forming a non-volatile memory cell, the method comprising:

forming a tunnel oxide on a substrate;

forming a floating gate on the tunnel oxide, the floating gate comprising substantially undoped polycrystalline silicon;

forming an interpoly dielectric layer on the floating gate;

forming at least a portion of a control gate on the interpoly dielectric layer, the control gate comprising polycrystalline silicon; and implanting dopants through said at least a portion of the control gate, the interpoly dielectric layer, and into the floating gate.

17. The method as recited in claim 16, further comprising:

completing formation of the control gate, to form a completed control gate; and forming a silicide layer on the completed control gate.

18. The method as recited in claim 16, wherein the interpoly dielectric layer comprises a silicon dioxide/silicon nitride/silicon dioxide (ONO) film stack.

19. The method as recited in claim 16, wherein the dopants includes at least one dopant selected from a group comprising phosphorus (P), arsenic (As), antimony (Sb), boron (B), gallium (Ga), Indium (In) and aluminum (Al).

* * * * *